(12) United States Patent
Choy

(10) Patent No.: US 9,129,700 B2
(45) Date of Patent: Sep. 8, 2015

(54) SYSTEMS AND METHODS FOR ADAPTIVE SOFT PROGRAMMING FOR NON-VOLATILE MEMORY USING TEMPERATURE SENSOR

(71) Applicant: Jon S. Choy, Austin, TX (US)

(72) Inventor: Jon S. Choy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 223 days.

(21) Appl. No.: 13/746,841

(22) Filed: Jan. 22, 2013

(65) Prior Publication Data

US 2014/0204694 A1 Jul. 24, 2014

(51) Int. Cl.
| | |
|---|---|
| G11C 7/04 | (2006.01) |
| G11C 16/34 | (2006.01) |
| G11C 16/10 | (2006.01) |
| G11C 16/04 | (2006.01) |
| G11C 29/02 | (2006.01) |
| G11C 29/50 | (2006.01) |

(52) U.S. Cl.
CPC ............... *G11C 16/345* (2013.01); *G11C 7/04* (2013.01); *G11C 16/0483* (2013.01); *G11C 16/10* (2013.01); *G11C 29/021* (2013.01); *G11C 29/028* (2013.01); *G11C 2029/5002* (2013.01)

(58) Field of Classification Search
CPC .. G11C 16/10; G11C 16/0483; G11C 16/349; G11C 16/12
USPC ............... 365/185.3, 185.01, 185.03, 185.05, 365/185.09, 185.11, 185.17, 185.1, 8, 365/185.19, 185.21, 185.22, 185.23, 365/185.24, 185.26, 185.29
See application file for complete search history.

(56) References Cited

U.S. PATENT DOCUMENTS

| | | | |
|---|---|---|---|
| 5,991,201 A | 11/1999 | Kuo et al. | |
| 7,079,424 B1 | 7/2006 | Lee et al. | |
| 7,173,859 B2 | 2/2007 | Hemink | |
| 7,177,199 B2 | 2/2007 | Chen et al. | |
| 2008/0106928 A1* | 5/2008 | Happ et al. | 365/148 |
| 2010/0271877 A1* | 10/2010 | Aritome | 365/185.03 |
| 2011/0290018 A1* | 12/2011 | Jeftic-Stojanovski et al. | 73/493 |
| 2012/0188826 A1* | 7/2012 | Hirose et al. | 365/185.29 |
| 2012/0201082 A1 | 8/2012 | Choy et al. | |
| 2012/0256772 A1* | 10/2012 | Wani et al. | 341/110 |
| 2012/0327710 A1* | 12/2012 | He et al. | 365/185.2 |
| 2012/0327720 A1 | 12/2012 | Eguchi et al. | |
| 2014/0029335 A1* | 1/2014 | Mu et al. | 365/185.2 |

\* cited by examiner

*Primary Examiner* — Fernando Hidalgo

(57) ABSTRACT

Erasing of a non-volatile memory (NVM) having an array of bit cells includes soft programming after an initial erasing of the bit cells. Over-erased bit cells are determined. A temperature is detected. A first soft program gate voltage based on the temperature is provided. Soft programming on the over-erased bit cells using the first soft program gate voltage is performed. Any remaining over-erased bit cells are identified. if there are any remaining over-erased bit cells, soft programming is performed on the remaining over-erased bit cells using a second soft program gate voltage incremented from the first soft program gate voltage.

20 Claims, 6 Drawing Sheets

SYSTEMS AND METHODS FOR ADAPTIVE SOFT PROGRAMMING FOR NON-VOLATILE MEMORY USING TEMPERATURE SENSOR

BACKGROUND OF THE DISCLOSURE

1. Field of the Disclosure

The present disclosure relates in general to non-volatile memories, and more specifically to systems and methods for adaptive soft programming for non-volatile memory using a temperature sensor to improve the total erase operation time.

2. Description of the Related Art

During a typical erase operation of a non-volatile memory (NVM) block, such as electrically erasable programmable read only memories (EPROMs), electrically erasable programmable read only memories (EEPROMs), block erasable EEPROMs (e.g., "Flash" memories), etc., a preprogram procedure is performed to raise the threshold voltages of the memory cells of the memory block to a level at or above a program verify voltage. For the erase operation, the preprogram procedure is followed by a Fowler-Nordheim (FN) erase procedure to lower the threshold voltages of the memory cells of the memory block to a level at or below an erase verify voltage. In the FN erase procedure, however, the resulting distribution may include memory cells which have been over erased, which results in increased column leakage. Furthermore, the problem of column leakage increases as the memory cells are further scaled, causing, for example, a subsequent program operation to fail due to lowered drain bias, or a read operation to fail since the over-erased memory cells may prevent sense amplifiers from distinguishing between an erased cell and a programmed cell. A soft program procedure may be used after the FN erase procedure to compress the distribution of the erased cells so as to reduce the column leakage.

As the technology and feature size of the memory cells become smaller, the soft programming procedure is a significant portion of the time required to complete the erase procedure. It is therefore desirable to reduce the amount of time required for the soft programming procedure.

BRIEF DESCRIPTION OF THE DRAWINGS

The benefits, features, and advantages of the present disclosure will become better understood with regard to the following description, and accompanying drawings where.

DETAILED DESCRIPTION

The following description is presented to enable one of ordinary skill in the art to make and use the present disclosure as provided within the context of a particular application and its requirements. Various modifications to the preferred embodiment will, however, be apparent to one skilled in the art, and the general principles defined herein may be applied to other embodiments. Therefore, the present disclosure is not intended to be limited to the particular embodiments shown and described herein, but is to be accorded the widest scope consistent with the principles and novel features herein disclosed.

Embodiments of systems and method disclosed herein use a temperature sensor to provide temperature data of non-volatile memory cells to a NVM controller. The temperature data is used to determine an initial gate voltage to use during a soft programming procedure. Thus, the gate voltage used to soft program memory cells may be relatively low at lower temperatures, and increasingly higher as the temperature of the memory cells increases. The ability to vary soft program gate voltage with temperature helps speed up the process at higher temperatures when more time is typically required to soft program memory cells.

Figure 1:
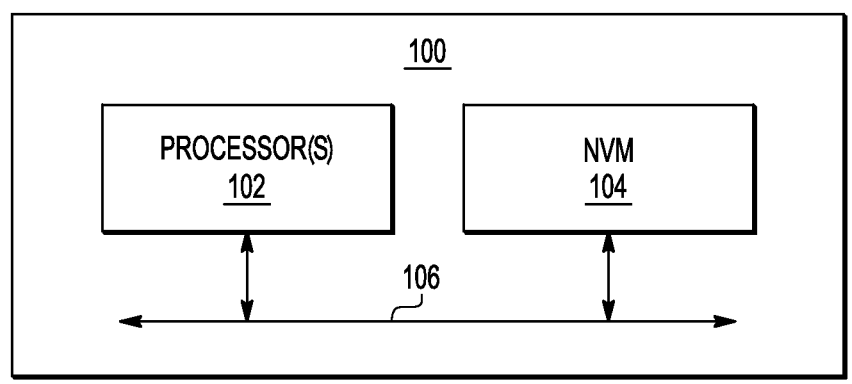
FIG. 1 is a block diagram of an integrated circuit including a non-volatile memory (NVM) according to one embodiment.

FIG. 1 is a block diagram of an integrated circuit 100 including a non-volatile memory (NVM) 104 according to one embodiment. In the illustrated embodiment, the integrated circuit (IC) 100 may implement a system on a chip (SOC) or the like which includes at least one processor 102 coupled to the NVM 104 via an appropriate interface 106, such as a bus or the like with multiple signals or bits. The IC 100 may include other circuits, modules or devices, such as other memory devices (not shown), other functionally modules (not shown), and external interfaces, such as input, output or input/output (I/O) ports or pins or the like (not shown). In one alternative embodiment, the NVM 104 is integrated on the IC 100 alone without any other devices. In another alternative embodiment, the processor 102, NVM 104 and interface 106 are part of a larger system on the IC 100.

Figure 2:
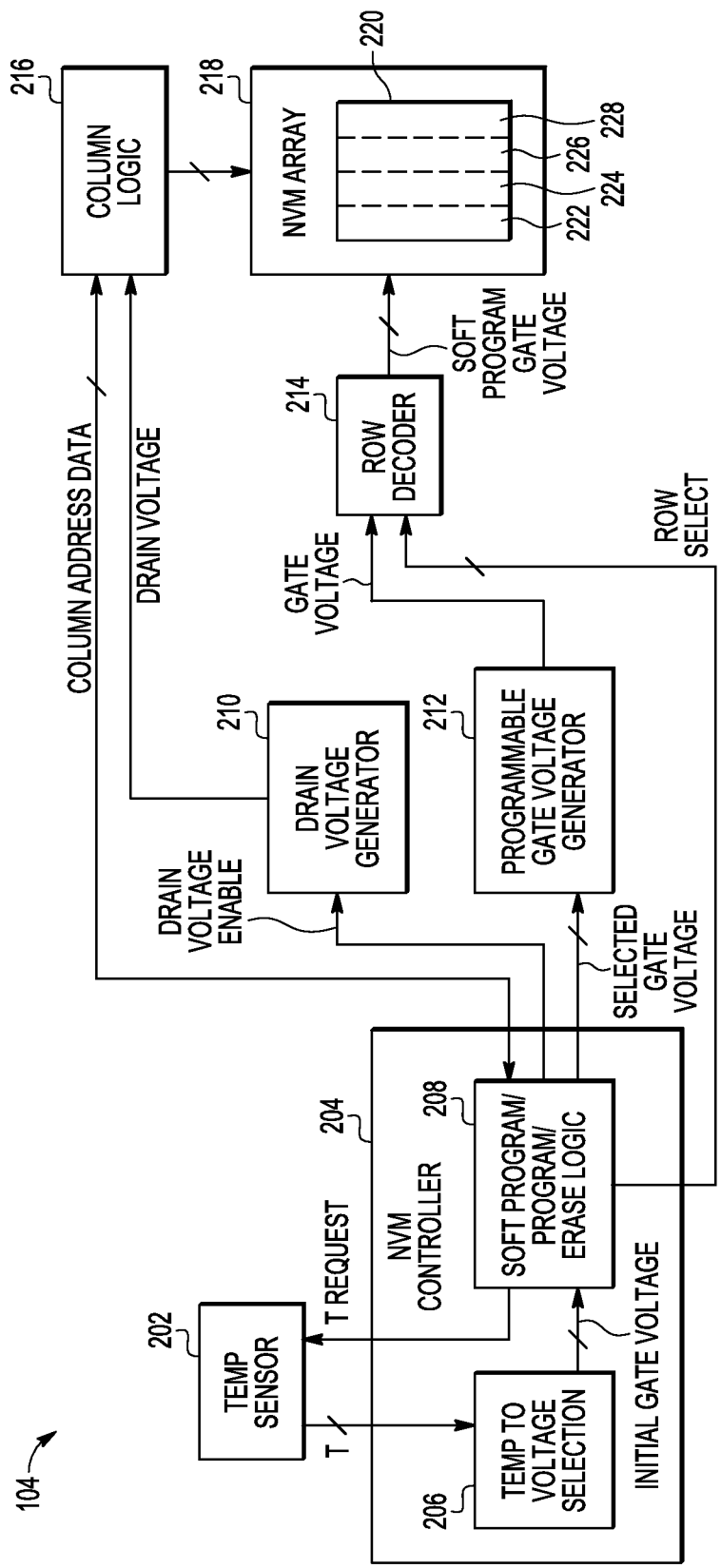
FIG. 2 is a more detailed block diagram of the NVM according to one embodiment.

FIG. 2 is a more detailed block diagram of the NVM 104 according to one embodiment. The NVM 104 includes temperature sensor 202, a NVM controller 204 with temperature to voltage selection (TTVS) logic 206, and soft program/program/erase (SPPE) logic 208, drain voltage generator 210, programmable gate voltage generator 212, row decoder 214, column logic 216 and NVM array 218. The column logic 216 incorporates a column decoder and sense amplifiers (not shown) and each interface is shown with multiple signals or bits. The NVM controller 204 controls operation of the NVM array 218 through the row decoder 214 and the column logic 216, such as in response to the processor(s) 102 (FIG. 1) as communicated through the interface 106 or other interfaces. The NVM controller 204 accesses memory cells within the NVM array 218 by providing a row address to the row decoder 214 and a column address to the column logic 216. Data is written into or read from the NVM array 218 via the column logic 216. The NVM array 218 incorporates one or more blocks 222, 224, 226, 228 of memory cells 220 in which each memory block 222-228 has a selected block size, such as, for example, 16 kilobytes (kB), 32 kB, 64 kB, 128 kB, 256 kB, etc. As shown, the NVM array 218 includes four memory blocks, but may include any suitable number of blocks.

Memory cells 220 have a gate terminal, a drain terminal and a source terminal along with isolated wells including a pwell and an nwell (not shown). In one embodiment, each memory block is organized into rows and columns of the memory cells 220. The gate terminal of each row of memory cells 220 is coupled to a corresponding one of multiple word-lines coupled to the row decoder 214. The drain terminal of each column of memory cells 220 is coupled to a corresponding one of multiple bit lines coupled to the column logic 216.

The source terminal and wells of each memory cell 220 are driven or controlled by the NVM controller 204. In one embodiment, the NVM controller 204 drives individual voltage levels to the gate, drain, source, well terminals.

Upon request from SPPE logic 208, temperature sensor 202 supplies a temperature reading to TTVS logic 206. In the embodiment shown, the temperature reading is supplied as series of bits in a digital signal. TTVS logic 206 uses the temperature reading to determine an initial gate voltage to use during the soft program procedure. TTVS logic 206 may be implemented using table-lookup routine(s), a scale factor, or other suitable technique for selecting a soft program gate voltage based on temperature.

SPPE logic 208 receives the initial soft program gate voltage from SPPE logic 208. The initial value of the soft program gate voltage may be used during an initial soft program pulse, but if all of the memory cells are not within a predetermined range of voltage levels, the SPPE logic 208 may increment the soft program gate voltage supply a selected gate voltage to programmable gate voltage generator (PGVG) 212.

SPPE logic also supplies a drain voltage enable signal to drain voltage generator 210. Drain voltage generator 210 outputs an analog drain voltage signal to column logic 216 when the drain voltage enable signal indicates that the drain voltage signal should be output.

PGVG 212 converts the selected gate voltage received from the SPPE logic 208 to an analog gate voltage signal, and supplies the gate voltage signal to row decoder 214.

The temperature sensor 202 may be implemented using any suitable temperature sensor that provides a voltage proportional to temperature and that drives an analog to digital converter, such as a sigma-delta analog to digital converter.

The memory cells 220 are implemented according to any one of several configurations, such as semiconductor configurations, layered silicon-metal nano crystals, NOR type NVM cells, one T type cells, one and half T type cells, two T type cells, floating gate type cells, etc. In one embodiment, each memory cell 220 is implemented on a silicon substrate or the like. Each memory cell 220 includes a stacked gate structure or the like, including an oxide layer (not shown) formed on a pwell, a floating gate provided on the oxide layer, a dielectric layer provided on the floating gate, and a control gate provided on the dielectric layer forming a gate terminal. The pwell is generally coupled to a ground voltage Vss and the nwell is generally coupled to a source voltage except during FN erase pulses as described herein.

In one embodiment, when a soft program pulse is applied to the memory cell 220 during an erase operation as further described herein, the gates of the memory cells 220 are coupled or otherwise driven together to collectively receive a soft program voltage. As described herein, a "soft program pulse" is said to be applied to each memory cell 220 of the memory block 202 in which the gate terminal is driven to a selected soft program gate voltage which may successively increase until the memory block is soft programmed. The magnitude of the soft program ramp pulse voltage applied to the gates can be incrementally increased with each application of a soft program pulse to the memory cells until the memory block 202 is soft programmed.

The present disclosure is described using an exemplary NVM technology in which the soft program gate voltage is applied to the gate of the memory cells. In alternative embodiments, such as those using other NVM technologies and the like, the soft program voltage is instead applied to a different connection or terminal of the memory cells being erased, such as the drain terminal, the source terminal, or the like.

Figure 3:
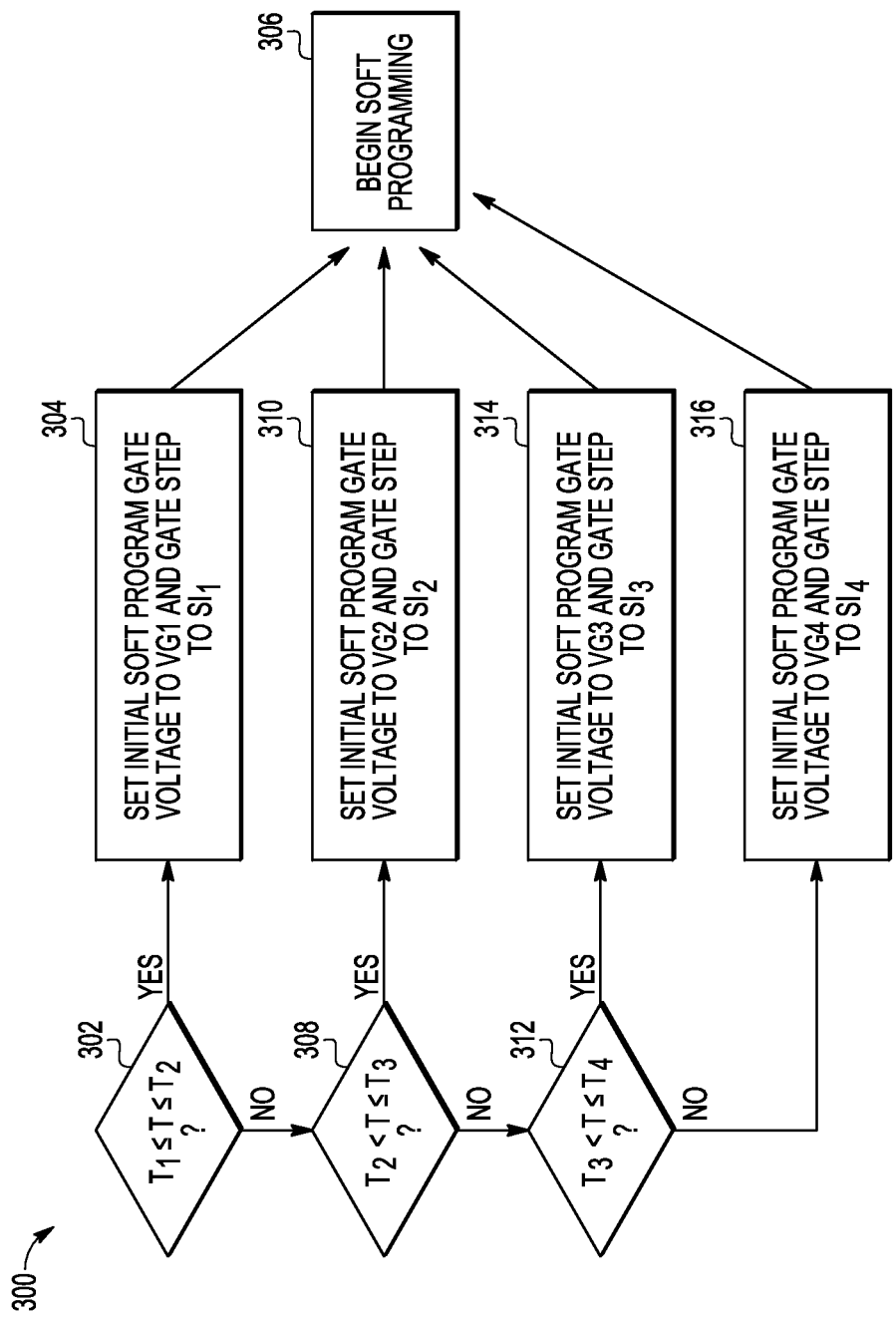
FIG. 3 is a simplified flowchart diagram of an embodiment of a method for selecting a soft program gate voltage controlled by the NVM controller of FIG. 2.

Referring to FIGS. 2 and 3, FIG. 3 is a simplified flowchart diagram of an embodiment of a method 300 for selecting an initial soft program gate voltage controlled by the NVM controller 204. Method 300 can be implemented in temperature to voltage selection logic 206, for example. Process 302 determines whether a first temperature T1 is less than or equal to the temperature T supplied by temperature sensor 202, as well as whether the temperature T supplied by temperature sensor 202 is less than or equal to a second temperature T2. If temperature T is between T1 and T2, or equal to T1 or T2, process 304 sets an initial soft program gate voltage to a first gate voltage VG1. Process 304 can also set a step or increment size to be used to increase the soft program gate voltage in a subsequent cycle if all of the memory cells are not within a specified range of soft programmed voltages. Process 306 begins the soft programming procedure using the first gate voltage VG1.

If temperature T is not between T1 and T2, and not equal to T1 or T2, process 308 determines whether the second temperature T2 is less than the temperature T supplied by temperature sensor 202, as well as whether the temperature T supplied by temperature sensor 202 is less than or equal to a third temperature T3. If temperature T is between T2 and T3, or equal to T3, process 310 sets the initial soft program gate voltage to a second gate voltage VG2. Process 310 can also set the step or increment size to be used to increase the soft program gate voltage in a subsequent cycle if all of the memory cells are not within the specified range of soft programmed voltages. Process 306 begins the soft programming procedure using the second gate voltage VG2.

If temperature T is not between T2 and T3, and not equal to T3, process 312 determines whether the third temperature T3 is less than the temperature T supplied by temperature sensor 202, as well as whether the temperature T supplied by temperature sensor 202 is less than or equal to a fourth temperature T4. If temperature T is between T3 and T4, or equal to T4, process 314 sets the initial soft program gate voltage to a third gate voltage VG3. Process 314 can also set the step or increment size to be used to increase the soft program gate voltage in a subsequent cycle if all of the memory cells are not within the specified range of soft programmed voltages. Process 306 begins the soft programming procedure using the third gate voltage VG3.

If temperature T is not between T3 and T4, and not equal to T4, process 316 sets the initial soft program gate voltage to a fourth gate voltage VG4. Process 316 can also set the step or increment size to be used to increase the soft program gate voltage in a subsequent cycle if all of the memory cells are not within the specified range of soft programmed voltages. Process 306 begins the soft programming procedure using the third gate voltage VG4.

Note that although four temperatures T1-T4 are used as an example in FIG. 3, additional or fewer number of temperatures can be tested in method 300 to determine an initial soft program gate voltage to begin the soft program procedure, as well as a soft program voltage increment or step size to use to adjust subsequent soft program gate voltage pulses.

Figure 4:
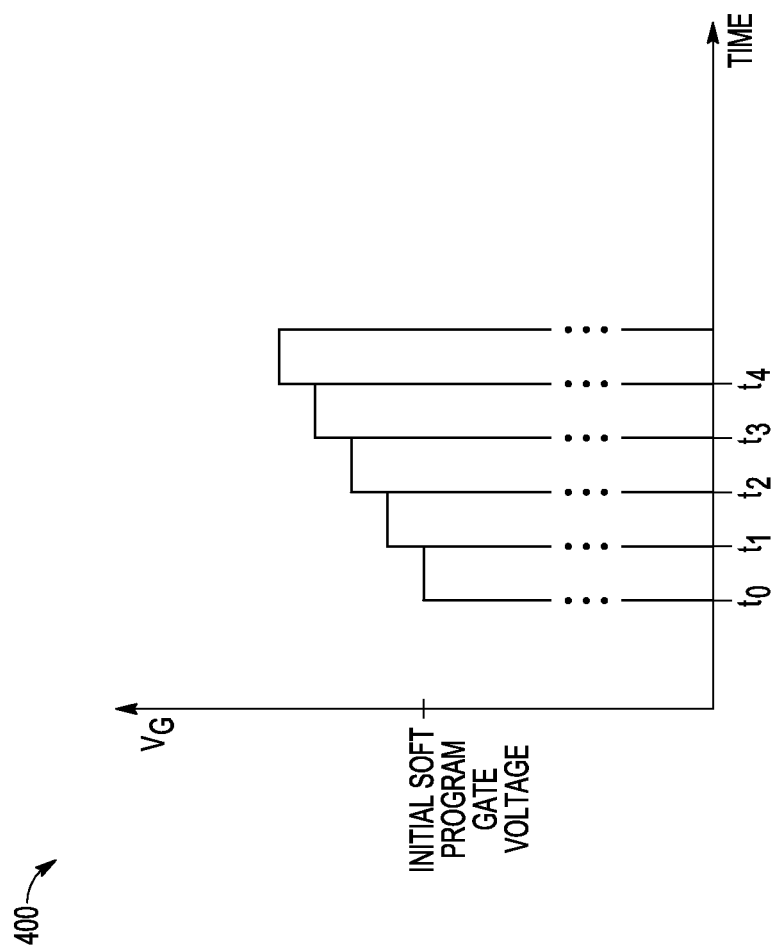
FIG. 4 is a time history diagram showing an example of the soft program gate voltage versus time during an erase operation according to the flowchart diagram of FIG. 3.

Referring to FIGS. 2 and 4, FIG. 4 is a time history diagram showing an example of the soft program gate voltage versus time during an erase operation according to the flowchart diagram of FIG. 3. The initial soft program gate voltage will vary according to the temperature data provided by temperature sensor 202. That is, the initial gate voltage will be proportional to the sensed temperature, with higher initial gate voltages being used at higher temperatures. Subsequent soft program gate voltages shown at times t1, t2, t3, t4 are incremented by a fixed step or increment in voltage. The step or increment in voltage may also be selected based on temperature, with larger steps or increments being used at higher temperatures.

Figure 5:
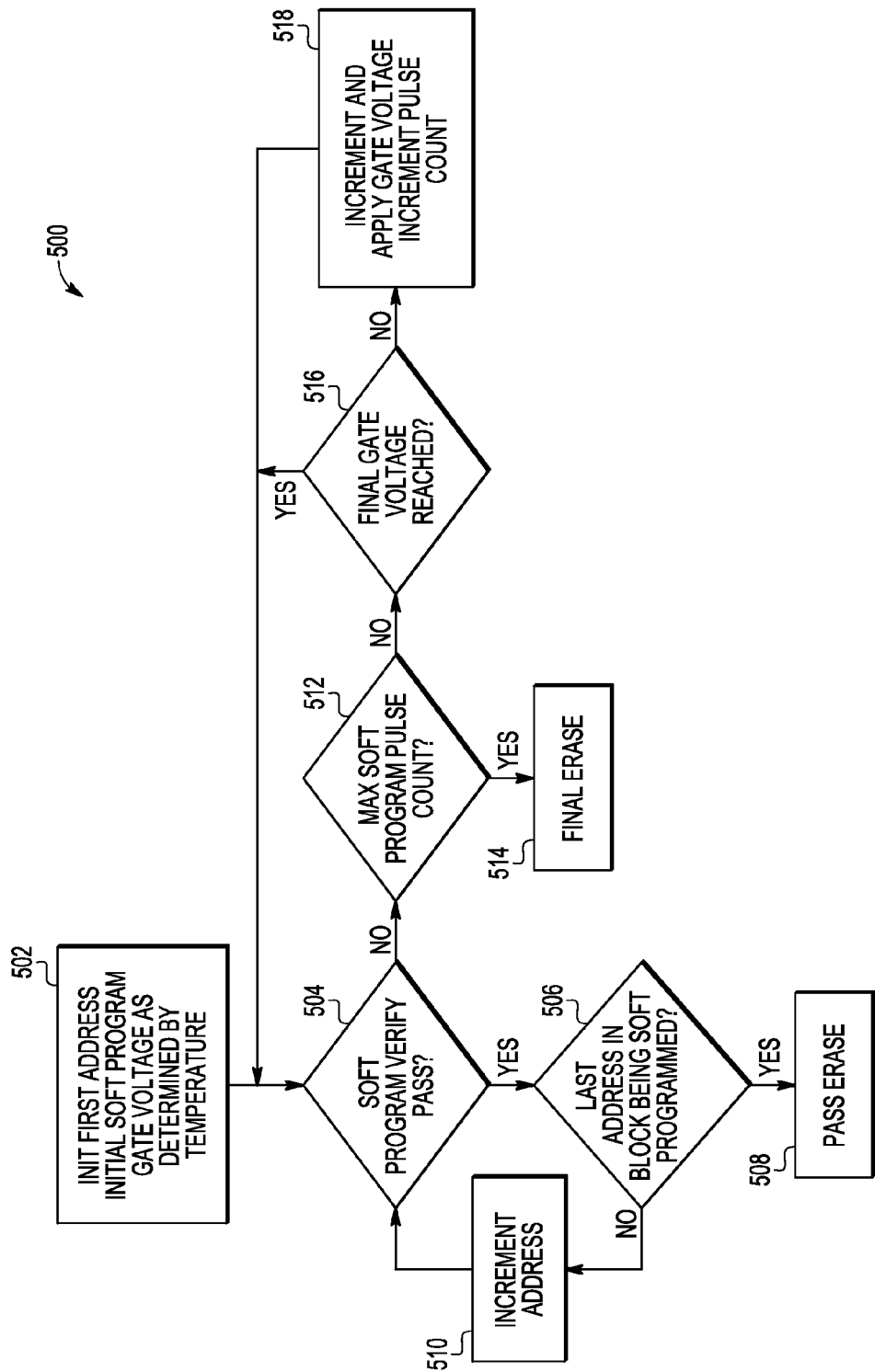
FIG. 5 is a simplified flowchart diagram of an embodiment of a soft program operation generally controlled by the NVM controller of FIG. 2.

FIG. 5 is a simplified flowchart diagram of an embodiment of method 500 of a soft program operation generally controlled by the NVM controller of FIG. 2. Process 502 can include initializing the soft program gate voltage to the initial soft program gate voltage determined in method 300 (FIG. 3) for a first address of the NVM array 220 (FIG. 2). The same initial soft program gate voltage will be used for all of the memory cells in the NVM array 220.

Process 504 determines whether the soft program procedure has passed or successfully completed for the particular memory cell being soft programmed. A successful completion occurs when the threshold voltage of the memory cell is between a soft program threshold voltage and an erased threshold voltage. Memory cells with threshold voltages below the soft program threshold voltage are considered to be in an over-erased state.

If the soft program procedure has completed for the memory cell, process 506 determines whether the soft program procedure has been performed on all of the memory cells by determining whether the address of the memory cell being soft programmed is the last address in the block being soft programmed. If the address is the last address in the block, process 508 indicates that the erase procedure was successful.

Referring again to process 506, if the soft program procedure is not being performed on the last address, process 510 increments the address and transitions to process 504 to determine whether the memory cell corresponding to the next address has been successfully soft programmed. When a memory cell has not been successfully soft programmed, process 504 transitions to process 512 to determine whether a maximum soft program pulse count has been reached. The soft program pulse count is incremented each time the soft program gate voltage is incremented. If the maximum soft program pulse count has been reached, process 512 transitions to process 514, which indicates that the erase procedure was not successful.

If the maximum soft program pulse count has not been reached, process 512 transitions to process 516 to determine whether a final soft program gate voltage has been reached. The initial and final soft program gate voltage is dependent on the type of technology being used to implement NVM array 220. For example, with 40 nm technology (i.e., 40 nm CMOS gate length), an initial soft program gate voltage can be 2.5 Volts and a maximum soft program gate voltage can be 3.5 Volts at room temperature. Other suitable voltages can be used. The maximum gate voltage may also be based on temperature, with higher maximum gate voltages being used at higher temperatures.

If the final soft program gate voltage has not been reached, process 516 transitions to process 518 to increment and apply the soft program gate voltage to the memory cell being soft programmed. The increment can be the voltage increment or step determined in method 300 (FIG. 3). The pulse count is also incremented. Process 518 then transitions to process 504 to determine whether the soft program verify passed for the memory cell being soft programmed.

If the final soft program gate voltage has been reached, process 516 transitions to process 504 to determine whether the soft program verify passed for the memory cell being soft programmed.

Figure 6:
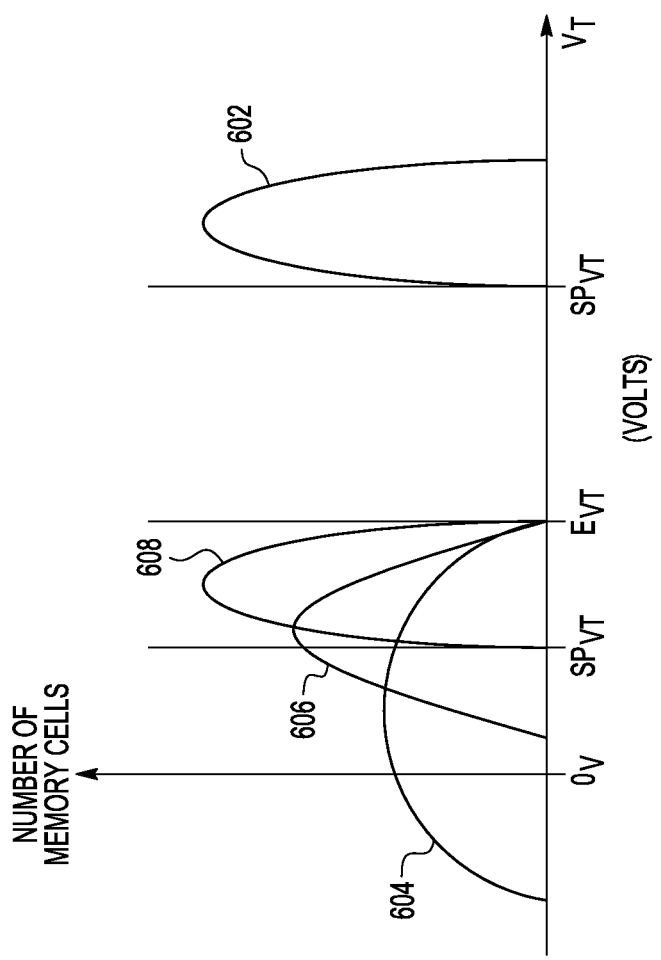
FIG. 6 is a graphic diagram illustrating threshold voltage (Vt) distributions of the memory cells of FIG. 2 during various phases of operation in accordance with one embodiment.

FIG. 6 is a graphic diagram illustrating threshold voltage (VT) distributions of the memory cells 220 of the memory array 218 of FIG. 2 during various phases of operation in accordance with one embodiment. Curve 602 represents a distribution of memory cells in a programmed state. The VT distribution of the memory cells 220 after a conventional FN erase procedure as shown by curve 604. A portion of the memory cells 220 which have been over erased by the conventional FN erase procedure since have a threshold voltage VT below the SPVT voltage. A remaining portion of curve 604 illustrates the number of memory cells 220 which fall within the desired voltage range between SPVT and EVT inclusive.

Curve 606 figuratively illustrates an exemplary VT distribution of the memory cells 220 after a compaction procedure is completed in accordance with an embodiment in which VT of each memory cell 220 is at or below the EVT voltage.

Curve 608 figuratively illustrates a desired VT distribution of the memory cells 220 after a soft programming procedure is completed in which VT is at or below EVT but also at or above a soft program verify threshold voltage (SPVT). The improvement is realized during the soft program procedure 306 when a higher initial soft program gate voltage is used at higher temperatures, thus substantially decreasing the amount of time required to complete the soft programming procedure at higher temperatures.

By now it should be appreciated that, in some embodiments, there has been provided a method of soft programming a non-volatile memory (NVM) having an array of bit cells. The soft programming occurs after erasing the bit cells and can include determining over-erased bit cells; detecting a temperature; providing a first soft program gate voltage based on the temperature; performing soft programming on the over-erased bit cells using the first soft program gate voltage; and identifying any remaining over-erased bit cells. If there are any remaining over-erased bit cells, soft programming is performed on the remaining over-erased bit cells using a second soft program gate voltage incremented from the first soft program gate voltage.

In another aspect, the detecting a temperature can include using a temperature sensor to provide a temperature-related voltage; and coupling the temperature-related voltage to an analog to digital converter.

In another aspect, the providing a first soft program gate voltage can comprise providing a voltage select signal responsive to an output of the analog to digital signal; and using a programmable voltage generator to provide the first soft program gate voltage responsive to the voltage select signal.

In another aspect, the performing soft programming on the remaining over-erased bit cells can be further characterized by incrementing the voltage select signal to cause the programmable voltage generator to increment the first soft program gate voltage to obtain the second soft program gate voltage.

In another aspect, the method can further comprise identifying any further remaining over-erased bit cells. If there are any further remaining over-erased bit cells, performing soft programming on the further remaining over-erased bit cells using a third soft program gate voltage incremented from the second soft program gate voltage.

In another aspect, the method can further include continuing to determine if over-erased bit cells are resulting from soft programming and incrementing an immediately preceding soft program voltage until all of the over erased bit cells are sufficiently soft programmed; the maximum number of soft programming pulses has been applied; or the maximum magnitude of the soft program gate voltage has been used for soft programming.

In another aspect, the determining the over-erased bit cells can comprise determining which bit cells have a threshold voltage below a predetermined voltage.

In another aspect, a magnitude of the increment can be a function of the temperature.

In other embodiments, a non-volatile memory (NVM) can include an array of bit cells; a temperature sensor; a soft programming gate voltage selector coupled to the temperature sensor; and soft program logic coupled to coupled to the soft programming gate voltage selector. The soft program logic can control soft programming of the bit cells. A programmable gate voltage generator can be coupled to the soft program logic. A row decoder can be coupled to the programmable gate voltage generator, the array of bit cells, and the soft program logic. Column logic can be coupled to the soft program logic and the array of bit cells. The soft program logic can use the programmable gate voltage generator to provide a soft program gate voltage to the row decoder during a soft programming operation. The soft program gate voltage can be selected based on a temperature sensed by the temperature sensor.

In another aspect, the soft program logic can run soft programming on bit cells that are over-erased.

In another aspect, the soft program logic can increment the soft program gate voltage when over-erased bit cells remain after a soft program operation for a subsequent program operation on bit cells still over-programmed.

In another aspect, the soft program logic can complete a soft program process when all of the bit cells have a threshold voltage above a predetermined threshold voltage.

In another aspect, the temperature sensor can provide a digital output representative of the temperature sensed.

In another aspect, the soft program logic can determine that the soft program process has failed if a maximum number of soft program pulses have been applied to a bit cell or if a maximum soft program pulse voltage has been applied.

In another aspect, a magnitude that the soft program logic increments the soft program gate voltage can be based on the temperature.

In another aspect, the bit cells can comprise one of group consisting of NOR type NVM cells, one T type cells, one and half T type cells, two T type cells, floating gate type cells, nanocrystal type cells.

In still other embodiments, a method of erasing a non-volatile memory (NVM) having a plurality of NVM bit cells can include performing an erase step that causes a first portion of the bit cells to have a sufficiently low threshold voltage for reliable sensing and a second portion of the bit cells to be over-erased; sensing a temperature; providing a first soft program gate voltage based on the temperature; and performing a soft program operation on the over-erased bit cells using the first soft program gate voltage.

In another aspect, the method can further include identifying remaining over-erased bit cells; and performing a soft program operation on the remaining over-erased bit cells using a second soft program gate voltage that is greater than the first soft program gate voltage.

In another aspect, the second soft program gate voltage can be incremented above the first soft program gate voltage by an amount based on the temperature.

In another aspect, the second soft program gate voltage can be incremented above the first soft program gate voltage by a predetermined amount:

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of soft programming a non-volatile memory (NVM) having an array of bit cells, wherein the soft programming occurs after erasing the bit cells, comprising:
    determining over-erased bit cells;
    detecting a temperature;
    providing a first soft program gate voltage based on the temperature;
    performing soft programming on the over-erased bit cells using the first soft program gate voltage;
    identifying any remaining over-erased bit cells;
    if there are any remaining over-erased bit cells, performing soft programming on the remaining over-erased bit cells using a second soft program gate voltage incremented from the first soft program gate voltage.

2. The method of claim 1, wherein the detecting a temperature comprises:
    using a temperature sensor to provide a temperature-related voltage; and
    coupling the temperature-related voltage to an analog to digital converter.

3. The method of claim 2, wherein the providing a first soft program gate voltage comprises:
    providing a voltage select signal responsive to an output of the analog to digital signal; and
    using a programmable voltage generator to provide the first soft program gate voltage responsive to the voltage select signal.

4. The method of claim 3, wherein the performing soft programming on the remaining over-erased bit cells is further characterized by incrementing the voltage select signal to cause the programmable voltage generator to increment the first soft program gate voltage to obtain the second soft program gate voltage.

5. The method of claim 1, further comprising:
    identifying any further remaining over-erased bit cells;
    if there are any further remaining over-erased bit cells, performing soft programming on the further remaining over-erased bit cells using a third soft program gate voltage incremented from the second soft program gate voltage.

6. The method of claim 1, further comprising continuing to determine if over-erased bit cells are resulting from soft programming and incrementing an immediately preceding soft program voltage until:
    all of the over erased bit cells are sufficiently soft programmed;
    the maximum number of soft programming pulses has been applied; or
    the maximum magnitude of the soft program gate voltage has been used for soft programming.

7. The method of claim 1, wherein the determining the over-erased bit cells comprises determining which bit cells have a threshold voltage below a predetermined voltage.

8. The method of claim 1, wherein a magnitude of the increment is a function of the temperature.

9. A non-volatile memory (NVM), comprising:
    an array of bit cells;
    a temperature sensor;
    a soft programming gate voltage selector coupled to the temperature sensor;
    soft program logic coupled to coupled to the soft programming gate voltage selector, wherein the soft program logic controls soft programming of the bit cells;
    a programmable gate voltage generator coupled to the soft program logic;
    a row decoder coupled to the programmable gate voltage generator, the array of bit cells, and the soft program logic; and
    column logic coupled to the soft program logic and the array of bit cells,
    wherein the soft program logic uses the programmable gate voltage generator to provide a soft program gate voltage to the row decoder during a soft programming operation, and
    wherein the soft program gate voltage is selected based on a temperature sensed by the temperature sensor.

10. The NVM of claim 9, wherein the soft program logic runs soft programming on bit cells that are over-erased.

11. The NVM of claim 10, wherein the soft program logic increments the soft program gate voltage when over-erased bit cells remain after a soft program operation for a subsequent program operation on bit cells still over-programmed.

12. The NVM of claim 11, wherein the soft program logic completes a soft program process when all of the bit cells have a threshold voltage above a predetermined threshold voltage.

13. The NVM of claim 12, wherein the temperature sensor provides a digital output representative of the temperature sensed.

14. The NVM of claim 13, wherein the soft program logic determines that the soft program process has failed if a maximum number of soft program pulses have been applied to a bit cell or if a maximum soft program pulse voltage has been applied.

15. The NVM of claim 11, further comprising at least one of a group consisting of: a magnitude that the soft program logic increments the soft program gate voltage is based on the temperature, and a maximum soft programming voltage is based on the temperature.

16. The NVM of claim 9, wherein the bit cells comprise one of group consisting of NOR type NVM cells, one T type cells, one and half T type cells, two T type cells, floating gate type cells, nanocrystal type cells.

17. A method of erasing a non-volatile memory (NVM) having a plurality of NVM bit cells, comprising:
    performing an erase step that causes a first portion of the bit cells to have a sufficiently low threshold voltage for reliable sensing and a second portion of the bit cells to be over-erased;
    sensing a temperature;
    providing a first soft program gate voltage based on the temperature;
    performing a soft program operation on the over-erased bit cells using the first soft program gate voltage.

18. The method of claim 17, further comprising:
    identifying remaining over-erased bit cells;

performing a soft program operation on the remaining over-erased bit cells using a second soft program gate voltage that is greater than the first soft program gate voltage.

19. The method of claim 18, wherein the second soft program gate voltage is incremented above the first soft program gate voltage by an amount based on the temperature.

20. The method of claim 18, wherein the second soft program gate voltage is incremented above the first soft program gate voltage by a predetermined amount.

* * * * *